United States Patent
Hsu et al.

(10) Patent No.: US 11,695,395 B2
(45) Date of Patent: Jul. 4, 2023

(54) LEVEL SHIFTER

(71) Applicant: MEDIATEK INC., Hsinchu (TW)

(72) Inventors: Hsin-Cheng Hsu, Hsinchu (TW); Federico Agustin Altolaguirre, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 17/578,643

(22) Filed: Jan. 19, 2022

(65) Prior Publication Data
US 2022/0329236 A1 Oct. 13, 2022

Related U.S. Application Data

(60) Provisional application No. 63/171,640, filed on Apr. 7, 2021.

(51) Int. Cl.
*H03K 3/356* (2006.01)
*H03K 19/0175* (2006.01)
*H03K 19/0185* (2006.01)

(52) U.S. Cl.
CPC .......... *H03K 3/356113* (2013.01); *H03K 19/018521* (2013.01)

(58) Field of Classification Search
None
See application file for complete search history.

(56) References Cited

U.S. PATENT DOCUMENTS

| 8,324,880 B2 | 12/2012 | Wang et al. |
| 8,638,157 B2 | 1/2014 | Duby et al. |
| 9,985,643 B2 * | 5/2018 | Kim ............... H03K 19/018521 |
| 10,630,268 B2 | 4/2020 | Hsu et al. |
| 2011/0018606 A1 * | 1/2011 | Cassia ............ H03K 19/018528 327/333 |

(Continued)

FOREIGN PATENT DOCUMENTS

| TW | 201105014 A | 2/2011 |
| TW | I343185 B | 6/2011 |

(Continued)

OTHER PUBLICATIONS

Extended European Search report dated Sep. 2, 2022, issued in application No. EP 22160493.7.

(Continued)

*Primary Examiner* — Kenneth B Wells
(74) *Attorney, Agent, or Firm* — McClure, Qualey & Rodack, LLP

(57) ABSTRACT

A level shifter with high reliability is shown, which has a cross-coupled pair and a pull-down pair. The cross-coupled pair couples a first power terminal to a first output terminal of the level shifter or a second output terminal of the level shifter. The pull-down pair has a first transistor and a second transistor, which are controlled according to an input signal of the level shifter. The first transistor is coupled between the second output terminal and a second power terminal, and the second transistor is coupled between the first output terminal and the second power terminal. A first voltage level coupled to the first power terminal is greater than a second voltage level coupled to the second power terminal, and the second voltage level is greater than the ground level.

14 Claims, 3 Drawing Sheets

(56) References Cited

U.S. PATENT DOCUMENTS

| | | | | |
|---|---|---|---|---|
| 2014/0132329 A1* | 5/2014 | Li | ................... | H03K 19/09421 |
| | | | | 327/333 |
| 2015/0280714 A1* | 10/2015 | Kumar | ............... | H03K 3/35613 |
| | | | | 327/333 |
| 2017/0272093 A1* | 9/2017 | Kim | ...................... | H03M 1/785 |
| 2019/0379365 A1 | 12/2019 | Hsu et al. | | |

FOREIGN PATENT DOCUMENTS

| | | |
|---|---|---|
| TW | 201251331 A | 12/2012 |
| TW | I496420 B | 8/2015 |
| TW | I681628 B | 1/2020 |

OTHER PUBLICATIONS

Chinese language office action dated Dec. 12, 2022, issued in application No. TW 111111226.

\* cited by examiner

LEVEL SHIFTER

CROSS REFERENCE TO RELATED APPLICATIONS

This application claims the benefit of U.S. Provisional Application No. 63/171,640, filed Apr. 7, 2021, the entirety of which is incorporated by reference herein.

BACKGROUND OF THE INVENTION

Field of the Invention

The present invention relates to a level shifter.

Description of the Related Art

As the technology used in the semiconductor manufacturing process develops (e.g., scaling down to 5 nm, 4 nm, 3 nm, or below), the maximum applied voltage is suppressed (e.g., down to 1.2V, much lower than the 1.8V applied to the 7 nm products). If there are 7 nm chips as well as more advanced (5 nm/4 nm/3 nm or below) chips on the same printed circuit board (PCB), the power system should provide an overdriving design, e.g. transferring two different voltage levels VDDQ and 2VDDQ (e.g., 2VDDQ is 2.5V or 3.3V) into two different power pins VDIO0 and VDIO1. In this field, a level shifter is required. A level shifter having high reliability is called for.

BRIEF SUMMARY OF THE INVENTION

An exemplary embodiment of the present invention provides a level shifter with high reliability no matter what the transistor threshold voltage is.

A level shifter in accordance with an exemplary embodiment of the present invention comprises a cross-coupled pair, and a pull-down pair. The cross-coupled pair couples a first power terminal to a first output terminal of the level shifter or a second output terminal of the level shifter. The pull-down pair has a first transistor and a second transistor, which are controlled according to an input signal of the level shifter. The first transistor is coupled between the second output terminal and a second power terminal, and the second transistor is coupled between the first output terminal and the second power terminal. A first voltage level coupled to the first power terminal is greater than a second voltage level coupled to the second power terminal, and the second voltage level is greater than the ground level.

In an exemplary embodiment, the first voltage level coupled to the first power terminal is an overdrive voltage, and the second voltage level equals a voltage level of a power source applied to a former stage that provides the input signal to the level shifter.

In an exemplary embodiment, the level shifter further includes a first control circuit, an inverter, and a second control circuit. The first control circuit receives the input signal and generates a first control signal to be coupled to the gate of the first transistor. The inverter receives the input signal and generates an inverted input signal, and the second control circuit receives the inverted input signal and generates a second control signal to be coupled to the gate of the second transistor.

In an exemplary embodiment, the first transistor is a p-channel metal-oxide-semiconductor field-effect transistor having a source coupled to the second output terminal, and a drain coupled to the second power terminal, and the second transistor is a p-channel metal-oxide-semiconductor field-effect transistor having a source coupled to the first output terminal, and a drain coupled to the second power terminal. The cross-coupled pair may have a third transistor and a fourth transistor. The third transistor is a p-channel metal-oxide-semiconductor field-effect transistor, having a source coupled to the first power terminal, a drain coupled to the second output terminal, and a gate coupled to the first output terminal. The fourth transistor is a p-channel metal-oxide-semiconductor field-effect transistor, having a source coupled to the first power terminal, a drain coupled to the first output terminal, and a gate coupled to the second output terminal.

In an exemplary embodiment, the first voltage level coupled to the first power terminal is an overdrive voltage. The first control signal generated by the first control circuit operates between the ground level and the overdrive voltage. The second control signal generated by the second control circuit operates between the ground level and the overdrive voltage.

In an exemplary embodiment, the first control circuit pulls up the first control signal when the input signal is low, and pulls down the first control signal when the input signal is high. The second control circuit pulls down the second control signal when the inverted input signal is high, and pulls up the second control signal when the inverted input signal is low.

In an exemplary embodiment, when the input signal is low, the first control circuit couples the gate of the first transistor to the second output terminal. When the input signal is high, the first control circuit couples the gate of the first transistor to a ground. When the inverted input signal is high, the second control circuit couples the gate of the second transistor to the ground. When the inverted input signal is low, the second control circuit couples the gate of the second transistor to the first output terminal.

In an exemplary embodiment, the first control circuit comprises a fifth transistor, a sixth transistor, and a seventh transistor. The fifth transistor is an n-channel metal-oxide-semiconductor field-effect transistor, having a gate receiving the input signal, and a source coupled to the ground. The sixth transistor is an n-channel metal-oxide-semiconductor field-effect transistor, having a source coupled to the drain of the fifth transistor, and a drain coupled to the gate of the first transistor. The seventh transistor is a p-channel metal-oxide-semiconductor field-effect transistor, having a source coupled to the second output terminal, and a drain coupled to the gate of the first transistor. The gate of the sixth transistor may be biased at a third voltage level greater than the ground level and lower than the overdrive level. The gate of the seventh transistor may be biased at a fourth voltage level greater than the ground level and lower than the overdrive level. The second voltage level may equal the third voltage level and may also equal the fourth voltage level. The second voltage level may further equal a fifth voltage level of a power source applied to a former stage that provides the input signal to the level shifter.

In an exemplary embodiment, the second control circuit comprises an eighth transistor, a ninth transistor, and a tenth transistor. The eighth transistor is an n-channel metal-oxide-semiconductor field-effect transistor, having a gate receiving the inverted input signal, and a source coupled to the ground. The ninth transistor is an n-channel metal-oxide-semiconductor field-effect transistor, having a source coupled to the drain of the eighth transistor, and a drain coupled to the gate of the second transistor. The tenth transistor is a p-channel metal-oxide-semiconductor field-effect transistor, having a source coupled to the first output terminal, and a drain coupled to the gate of the second transistor. The gate of the ninth transistor may be biased at a third voltage level greater than the ground level and lower than the overdrive level. The gate of the tenth transistor may be biased at a fourth voltage level greater than the ground level and lower than the overdrive level. The second voltage level may equal the third voltage level and may also equal the fourth voltage level. The second voltage level may further equal a fifth voltage level of a power source applied to a former stage that provides the input signal to the level shifter.

In the proposed design, the threshold voltage of the transistors no longer affects the shifted output.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
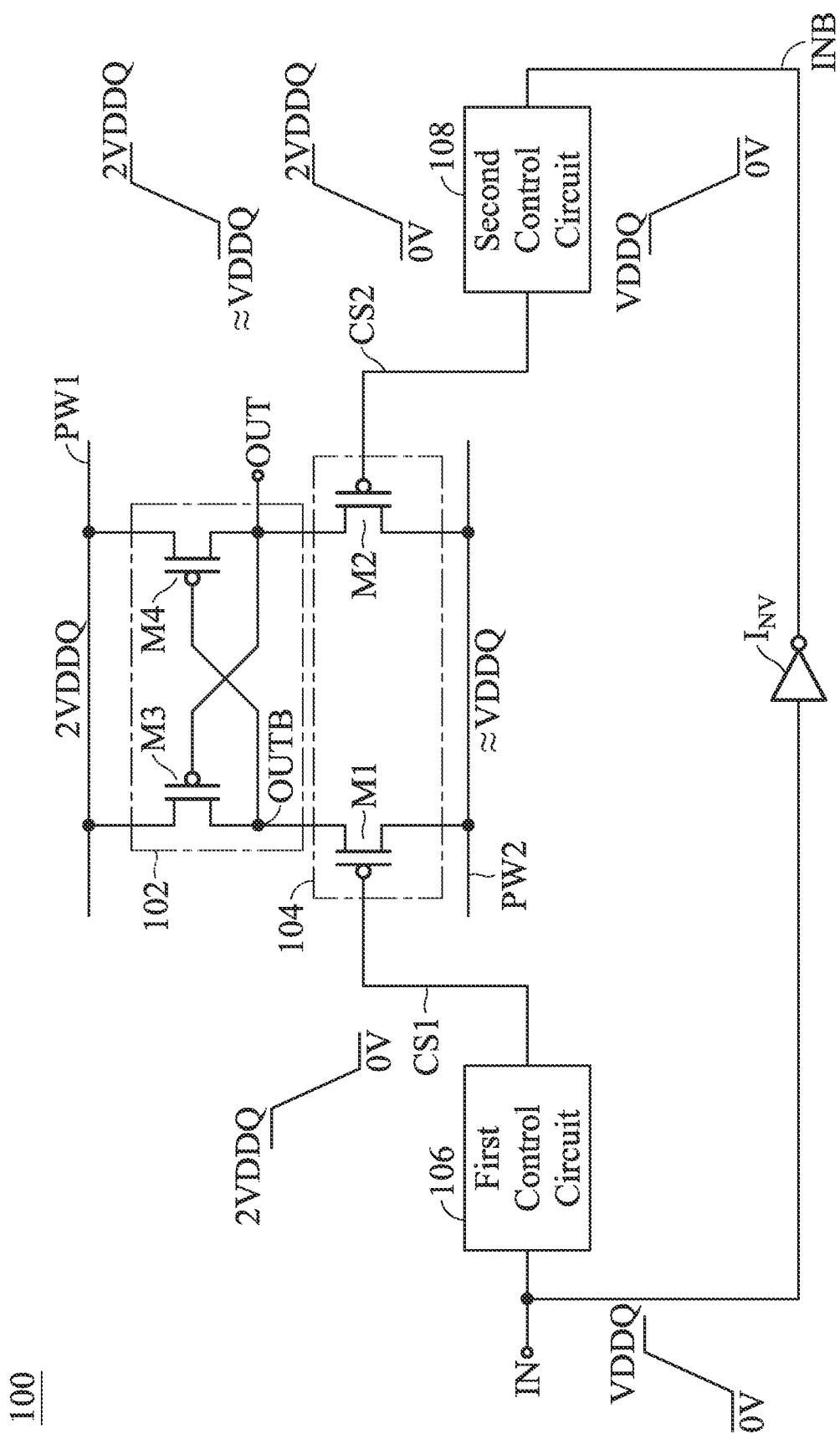
FIG. 1 illustrates a level shifter 100 in accordance with an exemplary embodiment of the present invention, which includes a cross-coupled pair 102, a pull-down pair 104, a first control circuit 106, an inverter Inv, and a second control circuit 108.

FIG. 1 illustrates a level shifter 100 in accordance with an exemplary embodiment of the present invention, which includes a cross-coupled pair 102, a pull-down pair 104, a first control circuit 106, an inverter Inv, and a second control circuit 108.

The cross-coupled pair 102 couples a first power terminal (illustrated as a power line PW1) to a first output terminal OUT of the level shifter 100 or a second output terminal OUTB of the level shifter 100. The pull-down pair 104 has a first transistor M1 and a second transistor M2, which are controlled according to an input signal IN of the level shifter 100. The first transistor M1 is coupled between the second output terminal OUTB and a second power terminal (illustrated as a power line PW2), and the second transistor M2 is coupled between the first output terminal OUT and the second power terminal PW2. A first voltage level (2VDDQ) coupled to the first power terminal PW1 is greater than a second voltage level (≈VDDQ) coupled to the second power terminal PW2, and the second voltage level (≈VDDQ) is greater than the ground level (0 volts). In this example, the first voltage level (2VDDQ) coupled to the first power terminal PW1 is an overdrive voltage. In another exemplary embodiment, the second voltage level equals a voltage level (VDDQ) of a power source applied to a former stage that provides the input signal IN to the level shifter 100.

As shown, an output signal (at the first output terminal OUT) shifted from the input signal IN operates between the second voltage level (≈VDDQ) and the first voltage level (2VDDQ). Without the effect of the transistor threshold voltage Vt, the output duty does not depend on the manufacture process.

The first transistor M1 is a p-channel metal-oxide-semiconductor field-effect transistor (PMOS) having a source coupled to the second output terminal OUTB, and a drain coupled to the second power terminal PW2. The second transistor M2 is a PMOS having a source coupled to the first output terminal OUT, and a drain coupled to the second power terminal PW2. The cross-coupled pair 102 may have a third transistor M3 and a fourth transistor M4. The third transistor M3 is a PMOS, having a source coupled to the first power terminal PW1, a drain coupled to the second output terminal OUTB, and a gate coupled to the first output terminal OUT. The fourth transistor M4 is a PMOS, having a source coupled to the first power terminal PW1, a drain coupled to the first output terminal OUT, and a gate coupled to the second output terminal OUTB.

The first control circuit 106 receives the input signal IN and generates a first control signal CS1 to be coupled to the gate of the first transistor M1. The inverter Inv receives the input signal IN and generates an inverted input signal INB. The second control circuit 108 receives the inverted input signal INB and generates a second control signal CS2 to be coupled to the gate of the second transistor M2. The first control signal CS1 generated by the first control circuit 106 and the second control signal CS2 generated by the second control circuit 108 both operate between the ground level (0 volts) and the overdrive voltage (2VDDQ). The first control circuit 106 pulls up the first control signal CS1 when the input signal IN is low (0 volts), and pulls down the first control signal CS2 when the input signal IN is high (VDDQ). The second control circuit 108 pulls down the second control signal CS2 when the inverted input signal INB is high (VDDQ), and pulls up the second control signal CS2 when the inverted input signal INB is low (0 volts).

Figure 2:
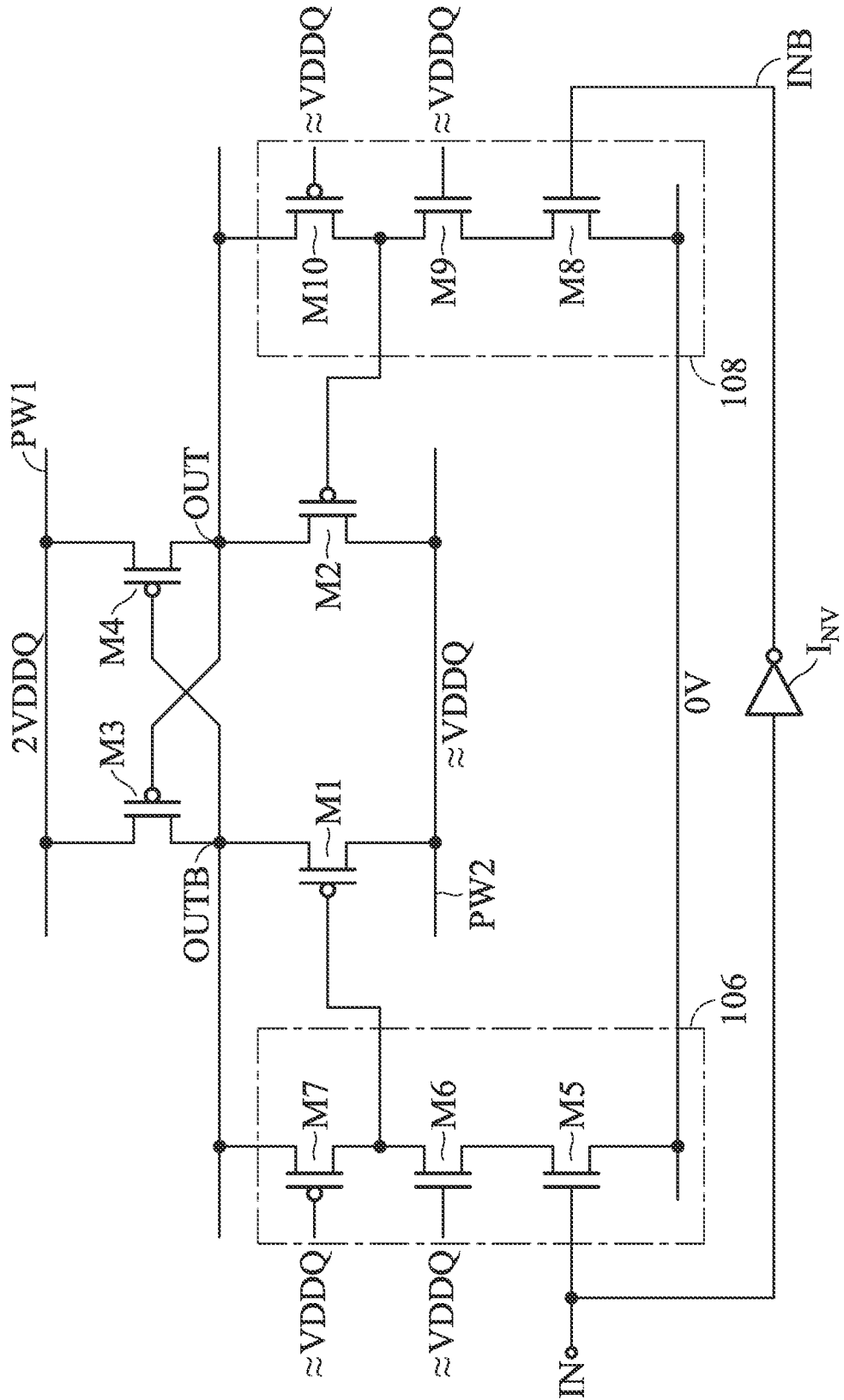
FIG. 2 illustrates the details of the first control circuit 106 and the second control circuit 108 in accordance with an exemplary embodiment of the present invention.

FIG. 2 illustrates the details of the first control circuit 106 and the second control circuit 108 in accordance with an exemplary embodiment of the present invention.

In FIG. 2, the first control circuit 106 has a fifth transistor M5, a sixth transistor M6, and a seventh transistor M7. The fifth transistor M5 is an n-channel metal-oxide-semiconductor field-effect transistor (NMOS), having a gate receiving the input signal IN, and a source coupled to the ground (0 volts). The sixth transistor M6 is an NMOS, having a source coupled to the drain of the fifth transistor M5, and a drain coupled to the gate of the first transistor M1. The seventh transistor M7 is a PMOS, having a source coupled to the second output terminal OUTB, and a drain coupled to the gate of the first transistor M1. The gate of the sixth transistor M6 is biased at a third voltage level (≈VDDQ) greater than the ground level (0 volts) and lower than the overdrive level (2VDDQ). The gate of the seventh transistor M7 is biased at a fourth voltage level (≈VDDQ) greater than the ground level (0 volts) and lower than the overdrive level (2VDDQ).

In FIG. 2, the second control circuit 108 has an eighth transistor M8, a ninth transistor M9, and a tenth transistor M10. The eighth transistor M8 is an NMOS, having a gate receiving the inverted input signal INB, and a source coupled to the ground (0 volts). The ninth transistor M9 is an NMOS, having a source coupled to the drain of the eighth transistor M8, and a drain coupled to the gate of the second transistor M2. The tenth transistor M10 is a PMOS, having a source coupled to the first output terminal OUT, and a drain coupled to the gate of the second transistor M2. The gate of the ninth transistor M9 is biased at a third voltage level (≈VDDQ) greater than the ground level (0 volts) and lower than the overdrive level (2VDDQ). The gate of the tenth transistor M10 is biased at a fourth voltage level (≈VDDQ) greater than the ground level (0 volts) and lower than the overdrive level (2VDDQ).

The voltage level applied to the second power terminal PW2 and the voltage levels applied to the gates of the sixth, seventh, ninth and tenth transistors M6, M7, M9 and M10 may be not identical. In an exemplary embodiment, the voltage level applied to the second power terminal PW2 equals the voltage level applied to the gates of the sixth, seventh, ninth and tenth transistors M6, M7, M9 and M10. In another example embodiment, the second power terminal PW2 and the gates of the sixth, seventh, ninth and tenth transistors M6, M7, M9 and M10 all are VDDQ all are biased at a voltage level VDDQ, which is provided by a power source coupled to a former stage that provides the input signal IN to the level shifter.

In some exemplary embodiments, there may be more PMOSs coupled between the gate of the first transistor M1 and the second output terminal OUTB, more PMOSs coupled between the gate of the second transistor M2 and the first output terminal OUT, more NMOSs coupling the gate of the first transistor M1 to the ground, and more NMOSs coupling the gate of the second transistor M2 to the ground.

Figure 3:
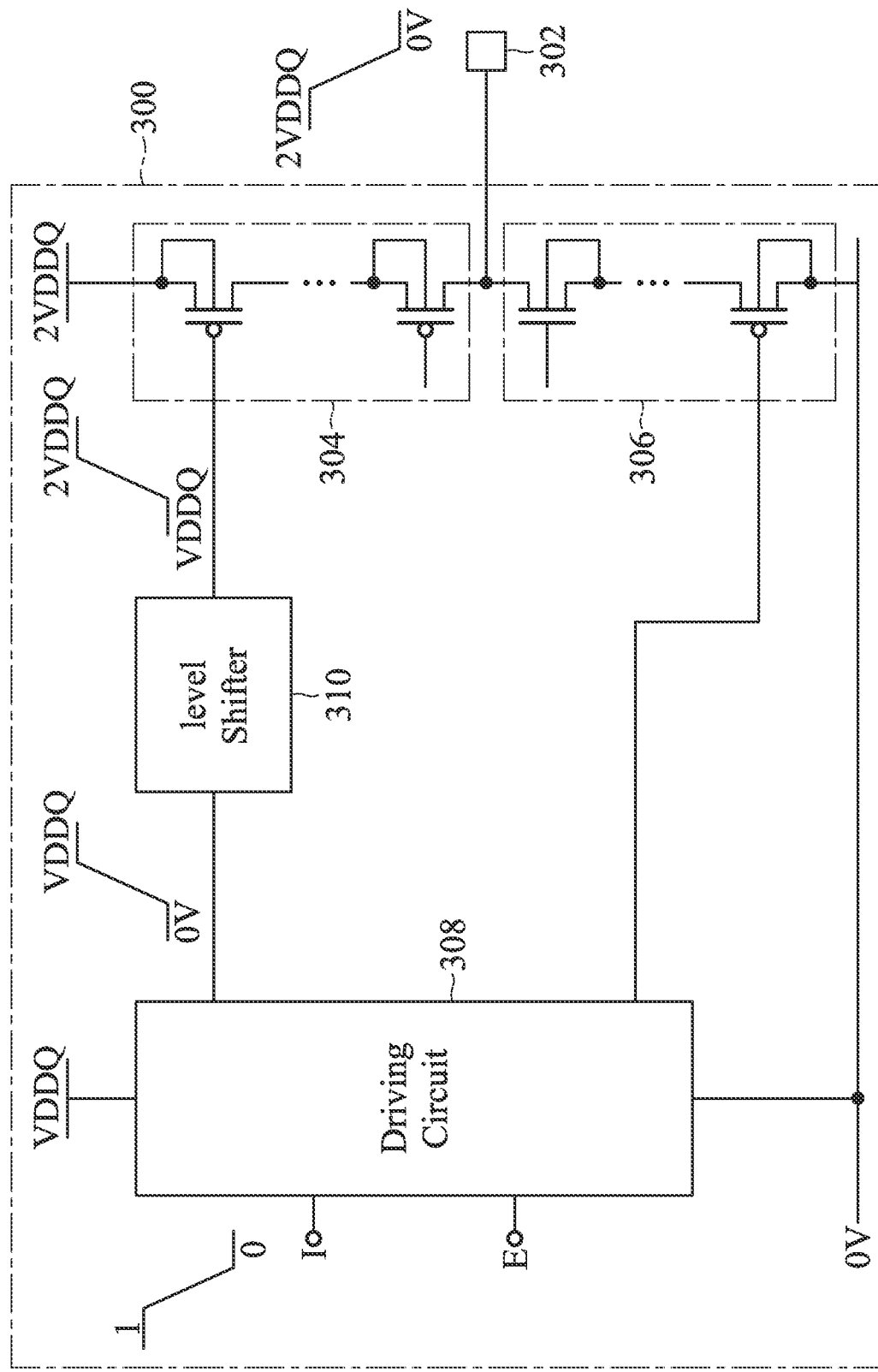
FIG. 3 illustrates an input and output (I/O) buffer 300 in accordance with an exemplary embodiment of the present invention, which is coupled to a pad 302.

FIG. 3 illustrates an input and output (I/O) buffer 300 in accordance with an exemplary embodiment of the present invention, which is coupled to a pad 302. The I/O buffer 300 comprises a pull-up string 304, a pull-down string 306, a driving circuit 308, and a level shifter 310. The power source of the driving circuit 308 is at a voltage level VDDQ. The power source of the pull-up string 304 and the pull-down string 306 is at a voltage level 2VDDQ which is an overdrive voltage. The level shifter 310 is designed according to the forgoing examples. In response to a high to low transition at an input port I of the driving circuit 308, the output of the driving circuit transits from 0 volts to VDDQ. Through the level shifter 310, the signal is shifted to transit from VDDQ to 2VDDQ, a proper voltage range to operate the pull-up string 304. The level shifter 310 is not affected by Vt variations.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A level shifter, comprising:
   a cross-coupled pair, coupling a first power terminal to a first output terminal of the level shifter or a second output terminal of the level shifter;
   a pull-down pair, comprising a first transistor and a second transistor controlled by an input signal of the level shifter;
   a first control circuit, receiving the input signal and generating a first control signal to be coupled to a gate of the first transistor; and
   an inverter and a second control circuit, wherein the inverter receives the input signal and generates an inverted input signal, and the second control circuit receives the inverted input signal and generates a second control signal to be coupled to a gate of the second transistor;
   wherein:
   the first transistor is coupled between the second output terminal and a second power terminal, and the second transistor is coupled between the first output terminal and the second power terminal;
   a first voltage level coupled to the first power terminal is greater than a second voltage level coupled to the second power terminal, and the second voltage level is greater than a ground level;
   the first transistor is a p-channel metal-oxide-semiconductor field-effect transistor, having a source coupled to the second output terminal, and a drain coupled to the second power terminal;
   the second transistor is a p-channel metal-oxide-semiconductor field-effect transistor, having a source coupled to the first output terminal, and a drain coupled to the second power terminal;
   at least one of the first and second control circuits comprises two n-channel metal-oxide-semiconductor field-effect transistors and one p-channel metal-oxide-semiconductor field-effect transistor;
   when the first control circuit comprises the two n-channel metal-oxide-semiconductor field-effect transistors and the one p-channel metal-oxide-semiconductor field-effect transistor, the two n-channel metal-oxide-semiconductor field-effect transistors are cascaded between the gate of the first transistor and a ground with a lower one of the two n-channel metal-oxide-semiconductor field-effect transistors controlled by the input signal, and the one p-channel metal-oxide-semiconductor field-effect transistor is coupled between the second output terminal of the level shifter and the gate of the first transistor, and
   when the second control circuit comprises the two n-channel metal-oxide-semiconductor field-effect transistors and the one p-channel metal-oxide-semiconductor field-effect transistor, the two n-channel metal-oxide-semiconductor field-effect transistors are cascaded between the gate of the second transistor and the ground with a lower one of the two n-channel metal-oxide-semiconductor field-effect transistors controlled by the inverted input signal, and the one p-channel metal-oxide-semiconductor field-effect transistor is coupled between the first output terminal of the level shifter and the gate of the second transistor.

2. The level shifter as claimed in claim 1, wherein:
   the first voltage level coupled to the first power terminal is an overdrive voltage; and
   the second voltage level equals a voltage level of a power source applied to a former stage that provides the input signal to the level shifter.

3. The level shifter as claimed in claim 1, wherein:
   the cross-coupled pair comprises a third transistor and a fourth transistor;
   the third transistor is a p-channel metal-oxide-semiconductor field-effect transistor, having a source coupled to the first power terminal, a drain coupled to the second output terminal, and a gate coupled to the first output terminal; and
   the fourth transistor is a p-channel metal-oxide-semiconductor field-effect transistor, having a source coupled to the first power terminal, a drain coupled to the first output terminal, and a gate coupled to the second output terminal.

4. The level shifter as claimed in claim 3, wherein:
the first voltage level coupled to the first power terminal is an overdrive voltage;
the first control signal generated by the first control circuit operates between the ground level and the overdrive voltage; and
the second control signal generated by the second control circuit operates between the ground level and the overdrive voltage.

5. The level shifter as claimed in claim 4, wherein:
the first control circuit pulls up the first control signal when the input signal is low, and pulls down the first control signal when the input signal is high; and
the second control circuit pulls down the second control signal when the inverted input signal is high, and pulls up the second control signal when the inverted input signal is low.

6. The level shifter as claimed in claim 4, wherein:
when the input signal is low, the first control circuit couples the gate of the first transistor to the second output terminal;
when the input signal is high, the first control circuit couples the gate of the first transistor to the ground;
when the inverted input signal is high, the second control circuit couples the gate of the second transistor to the ground; and
when the inverted input signal is low, the second control circuit couples the gate of the second transistor to the first output terminal.

7. The level shifter as claimed in claim 4, wherein:
the first control circuit comprises a fifth transistor, a sixth transistor, and a seventh transistor;
the fifth transistor is the lower one of the two n-channel metal-oxide-semiconductor field-effect transistors cascaded between the gate of the first transistor and the ground, having a gate receiving the input signal, and a source coupled to the ground;
the sixth transistor is another one of the two n-channel metal-oxide-semiconductor field-effect transistors cascaded between the gate of the first transistor and the ground, having a source coupled to a drain of the fifth transistor, and a drain coupled to the gate of the first transistor; and
the seventh transistor is the p-channel metal-oxide-semiconductor field-effect transistor coupled between the second output terminal of the level shifter and the gate of the first transistor, having a source coupled to the second output terminal, and a drain coupled to the gate of the first transistor.

8. The level shifter as claimed in claim 7, wherein:
a gate of the sixth transistor is biased at a third voltage level greater than the ground level and lower than the overdrive voltage; and
a gate of the seventh transistor is biased at a fourth voltage level greater than the ground level and lower than the overdrive voltage.

9. The level shifter as claimed in claim 8, wherein:
the second voltage level equals the third voltage level and also equals the fourth voltage level.

10. The level shifter as claimed in claim 9, wherein:
the second voltage level further equals a voltage level of a power source applied to a former stage that provides the input signal to the level shifter.

11. The level shifter as claimed in claim 4, wherein:
the second control circuit comprises an eighth transistor, a ninth transistor, and a tenth transistor;
the eighth transistor is the lower one of the two n-channel metal-oxide-semiconductor field-effect transistor cascaded between the gate of the second transistor and the ground, having a gate receiving the inverted input signal, and a source coupled to the ground;
the ninth transistor is another one of the two n-channel metal-oxide-semiconductor field-effect transistor cascaded between the gate of the second transistor and the ground, having a source coupled to a drain of the eighth transistor, and a drain coupled to the gate of the second transistor; and
the tenth transistor is the p-channel metal-oxide-semiconductor field-effect transistor coupled between the first output terminal of the level shifter and the gate of the second transistor, having a source coupled to the first output terminal, and a drain coupled to the gate of the second transistor.

12. The level shifter as claimed in claim 11, wherein:
a gate of the ninth transistor is biased at a third voltage level greater than the ground level and lower than the overdrive voltage; and
a gate of the tenth transistor is biased at a fourth voltage level greater than the ground level and lower than the overdrive voltage.

13. The level shifter as claimed in claim 12, wherein:
the second voltage level equals the third voltage level and also equals the fourth voltage level.

14. The level shifter as claimed in claim 13, wherein:
the second voltage level further equals a voltage level of a power source applied to a former stage that provides the input signal to the level shifter.

* * * * *